United States Patent
Balun et al.

(10) Patent No.: US 10,761,138 B2
(45) Date of Patent: Sep. 1, 2020

(54) LOW COST BUILT-IN-SELF-TEST CENTRIC TESTING

(71) Applicant: Advantest Corporation, Tokyo (JP)

(72) Inventors: Peter Balun, San Jose, CA (US); Chi Yuan, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 57 days.

(21) Appl. No.: 16/134,792

(22) Filed: Sep. 18, 2018

(65) Prior Publication Data
US 2020/0088790 A1    Mar. 19, 2020

(51) Int. Cl.
| | | |
|---|---|---|
| *G01R 31/317* | (2006.01) | |
| *G01R 31/28* | (2006.01) | |
| *G06F 13/16* | (2006.01) | |
| *G06F 13/42* | (2006.01) | |

(52) U.S. Cl.
CPC ... *G01R 31/31724* (2013.01); *G01R 31/2834* (2013.01); *G06F 13/1668* (2013.01); *G06F 13/4282* (2013.01); *G06F 2213/0028* (2013.01); *G06F 2213/0032* (2013.01)

(58) Field of Classification Search
CPC .......... G01R 31/31724; G01R 31/2834; G06F 13/1668; G06F 13/4282; G06F 2213/0028; G06F 2213/0032
See application file for complete search history.

(56) References Cited

U.S. PATENT DOCUMENTS

| | | | | |
|---|---|---|---|---|
| 6,429,029 B1* | 8/2002 | Eldridge | ............ | G01R 31/2884 |
| | | | | 257/E23.021 |
| 6,551,844 B1* | 4/2003 | Eldridge | ............ | G01R 1/07307 |
| | | | | 257/E23.021 |
| 2003/0237025 A1* | 12/2003 | Song | ................. | G01R 31/3167 |
| | | | | 714/30 |
| 2006/0132167 A1* | 6/2006 | Chen | ................. | G01R 31/2856 |
| | | | | 324/750.05 |
| 2006/0273809 A1* | 12/2006 | Miller | ................ | G01R 31/2889 |
| | | | | 324/750.05 |
| 2011/0098964 A1* | 4/2011 | Mullane | .............. | H03M 1/1085 |
| | | | | 702/123 |
| 2011/0291679 A1* | 12/2011 | Pagani | ............... | G01R 31/3172 |
| | | | | 324/750.01 |

(Continued)

OTHER PUBLICATIONS

Thirunavukkarasu, V., et al., "Performance of Low Power BISTArchitecture for UART," International Conference on Communication and Signal Processing, Date of Conference: Apr. 6-8, 2016, India, pp. 2290-2293. (Year: 2016).*

*Primary Examiner* — Kyle Vallecillo

(57) ABSTRACT

A Built-in-Self-Test (BIST) centric Automatic Test Equipment (ATE) framework can include a host controller and one or more tester units. The host controller can be configured to receive one or more inputs to initiate testing of a plurality of Devices Under Test (DUTs). The one or more tester unit can include a plurality of Universal Asynchronous Receiver-Transmitters (UARTs) communication links. The UART communication links can be configured to send one or more commands for initiating and controlling a Built-in-Self-Test (BIST) in the plurality of DUTs. The UART communication links can also be configured to receive test output data of the BIST from the plurality of DUTs. The host controller can also be configured to output the test output data of the BIST.

20 Claims, 3 Drawing Sheets

(56) References Cited

U.S. PATENT DOCUMENTS

| | | | |
|---|---|---|---|
| 2012/0191400 A1* | 7/2012 | Sontakke | G01R 31/31724 702/119 |
| 2013/0055022 A1* | 2/2013 | Chong | G06F 11/3656 714/28 |
| 2013/0055023 A1* | 2/2013 | Chong | G11C 29/56008 714/30 |
| 2014/0229782 A1* | 8/2014 | Rueter | G01R 31/31919 714/733 |
| 2014/0253099 A1* | 9/2014 | Han | G01R 19/00 324/126 |
| 2018/0003764 A1* | 1/2018 | Menon | H04W 4/80 |

* cited by examiner

LOW COST BUILT-IN-SELF-TEST CENTRIC TESTING

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices is the automated volume testing of the computing devices and/or components thereof.

Referring to FIG. 1 an Automatic Test Equipment (ATE) framework according to the conventional art is shown. The ATE framework is configured to provide for the functional testing of a plurality of Device Under Test (DUTs). The ATE framework can include a host controller 105, a communication backplane 1110, one or more tester units 115-115$m$, and one or more device interface boards 120$a$-120$m$. The communication backplane 110 can be configured to communicatively coupled the one or more tester units 115-115$m$ to the host controller 105. The one or more device interface boards 120$a$-120$m$ can be configured to couple a plurality of DUTs 125$a$-125$n$ to the respective one or more tester units 115$a$-115$m$ via connectors 130$a$-130$n$ of the DUTs 125$a$-125$n$. The connectors 130$a$-130$n$ can include one or more standard serial communication links, such as Serial Attached Small Computer System Interface (SAS) or Serial AT Attachment (SATA) communication.

The one or more tester units 115$a$-115$m$ are configured to generate test patterns and perform complex testing processes on the DUTs and gather test result from the DUTs, and process the results. However, some customers do not require such a level of complex and exhaustive testing. Accordingly, there is a continuing need from an Automated Test Equipment (ATE) framework that provides for simpler less expensive testing of DUTs.

SUMMARY OF THE INVENTION

The present technology may best be understood by referring to the following description and accompanying drawings that are used to illustrate embodiments of the present technology directed toward low cost Built-in-Self-Test (BIST) centric volume testing of Devices Under Test (DUTs).

In one embodiment, an Automatic Test Equipment (ATE) framework can include a host controller and one or more tester units. In aspects, the host controller can be configured to receive one or more inputs to initiate testing of a plurality of DUTs. The one or more tester unit can include a plurality of Universal Asynchronous Receiver-Transmitters (UARTs) communication links. The UARTs can be configured to send one or more commands for initiating and controlling a Built-in-Self-Test (BIST) on respective serial communication links to the plurality of DUTs.

The plurality of DUTs can include BIST circuits configured to receive, on the serial communication links from the one or more tester units, the one or more commands for initiating and controlling the BIST. The BIST circuits can generate test input data and execute the BIST using the test input data to generate test output data. The BIST circuits can also be configured to send, on the serial communication links, the test output data to the one or more tester units.

In aspects, the UARTs of the one or more tester units can be configured to receive the test output data of the BIST from the plurality of DUTs. The host controller can be configured to store and/or display the test output data of the BIST.

In another embodiment, an automatic test method can include receiving one or more inputs to initiate testing of a plurality of Devices Under Test (DUTs). The DUTs can be Serial Attached Small Computer System Interface (SAS) based Solid State Drives (SSD), Serial AT Attachment (SATA) based Solid State Drives (SSD), or the like devices. The method can also include sending commands for initiating and controlling a Built-in-Self-Test (BIST), wherein the commands are sent by a plurality of Universal Asynchronous Receiver-Transmitters (UARTs) on a plurality of respective serial communication links to the plurality of DUTs. The method can further include receiving test output data of the BIST, wherein the test output data is received by the plurality of UARTs on the plurality of serial communication links from the plurality of DUTs. The automatic test method can then conclude with outputting the test output data of the BIST.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
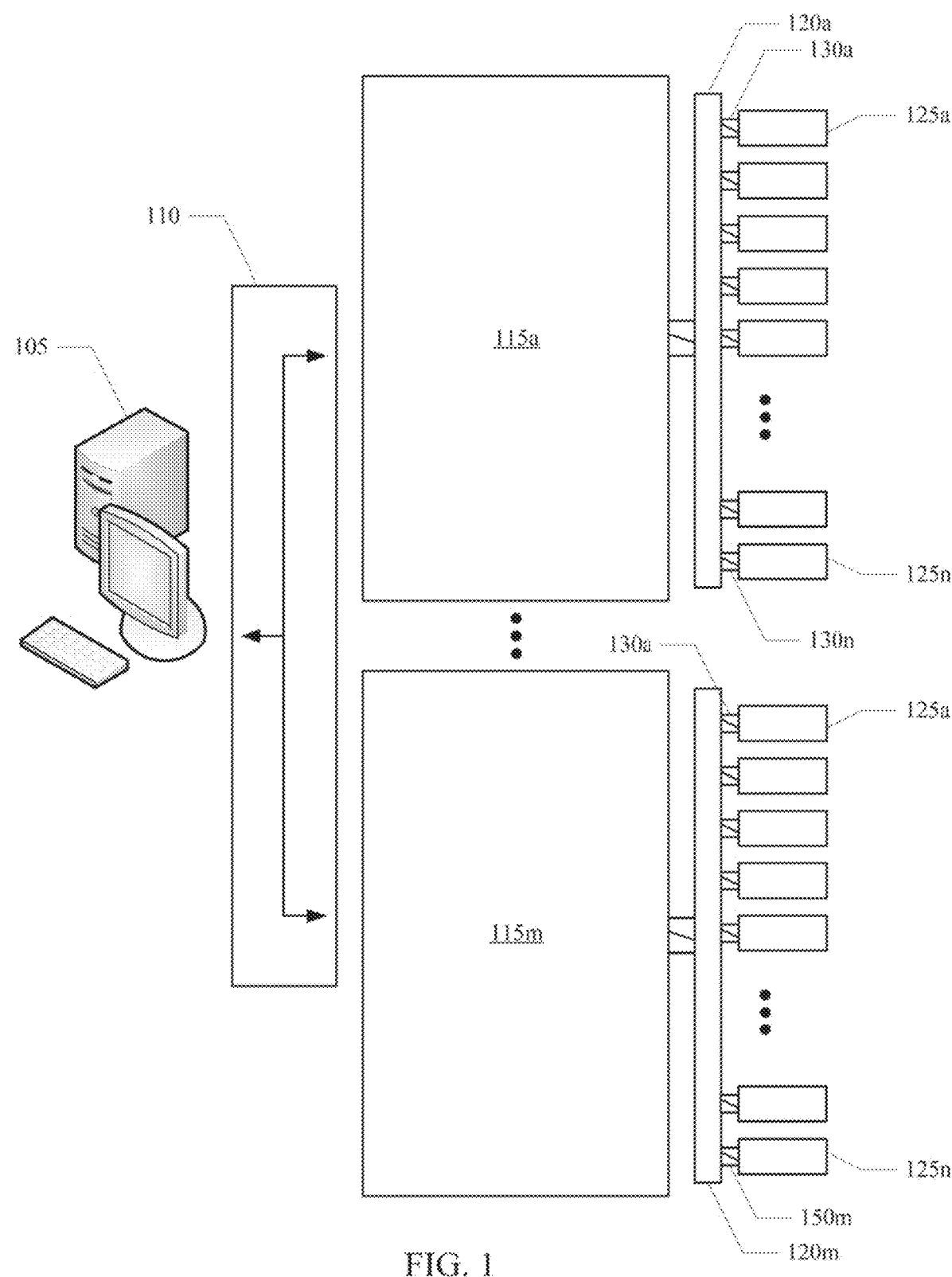
FIG. 1 shows an Automatic Test Equipment (ATE) framework according to the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
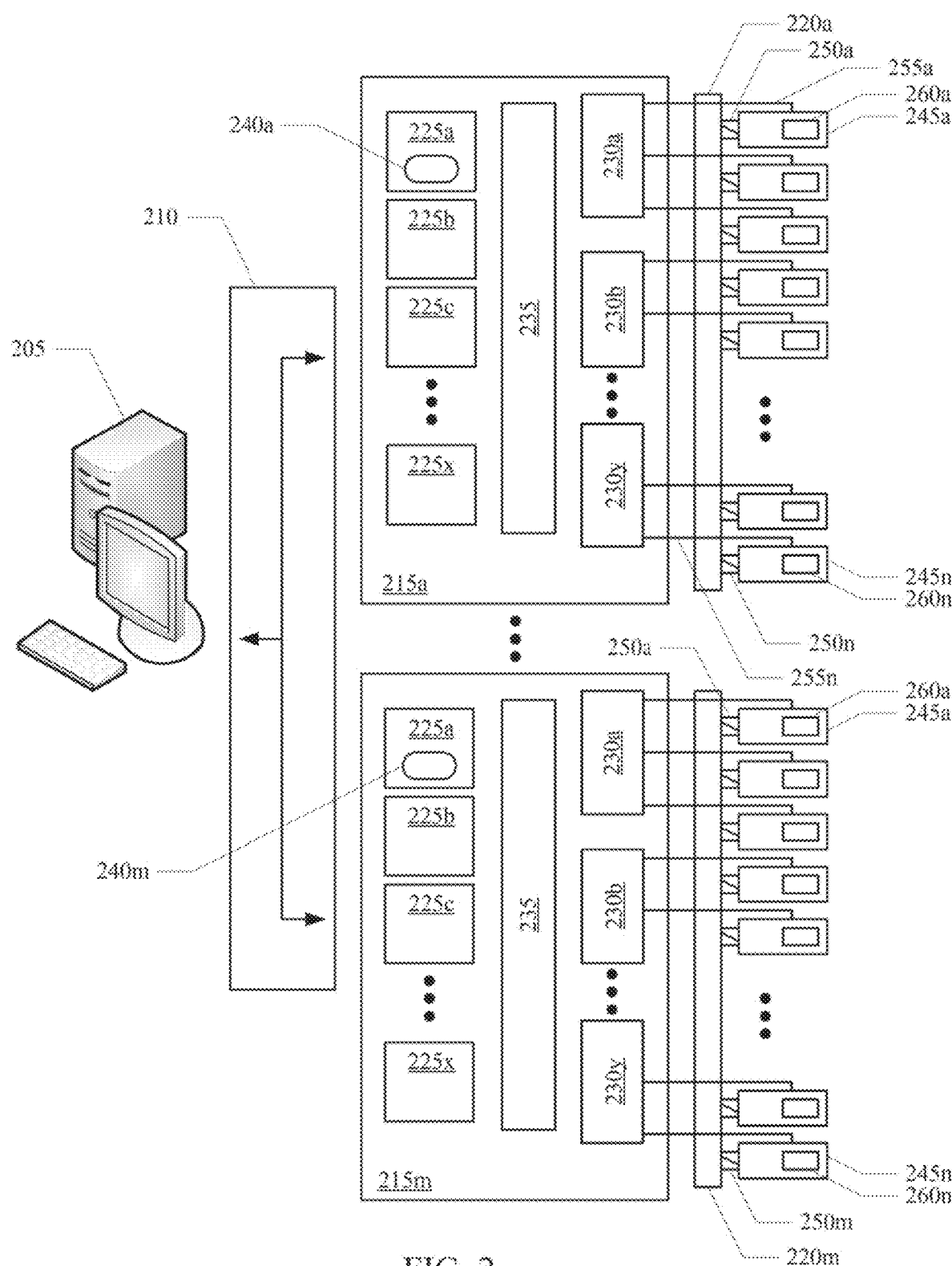
FIG. 2 shows an ATE framework, in accordance with aspects of the present technology.

FIG. 2 shows an Automated Test Equipment (ATE) framework, in accordance with aspects of the present technology. The ATE framework can include a host controller 205, a communication backplane 210, one or more tester units 215a-215m, and one or more Device Interface Boards (DIBs) 220a-220m. The one or more tester units 215a-215m are also conventionally referred to as tester primitives or tester slices. The communication backplane 210 can be configured to communicatively couple the one or more tester units 215a-215m to the host controller 205.

In aspects, the tester units 215a-215m can include a plurality of Processing Unit (PU) boards 225a-225x that can be coupled to a plurality of Field Programmable Array (FPGA) test boards 230a-230y via drivers 235. A given one of the plurality of PU boards 225a-225x of the respective one or more tester units 215a-215m can execute an instance of an embedded Operating System (OS) 240a-240m. In one implementation, the embedded OS 240a-240m can be a Linux based OS. In one implementation, the ATE framework can include up to 32 instances of the embedded OS 240a-240m, and the ATE framework can include up to 32 tester units 215a-215m.

The one or more DIBs 220a-220m can be configured to couple a plurality of Devices Under Test (DUTs) 245a-245n to the FPGA test boards 230a-230y of the respective one or more tester units 215a-215m via connectors 250a-250n of the DUTs 245a-245n. The DUTs 245a-245n can include Serial Attached Small Computer System Interface (SAS) or Serial AT Attachment (SATA) communication interfaces, and are therefore referred to as SAS or SATA based DUTs. In one implementation, the DUTs 245a-245n can be SAS or SATA based Solid State Drives (SSD). The connectors 250a-250n can include SAS or SATA communication links. The connectors 250a-250n can also provide one or more supply potential from the one or more tester units 215a-215m to the plurality of DUTs 245a-245n. Different device interface boards can be configured to support different DUTs 245a-245n. For example, different instances of the device interface board can support DUTs having different form factors, different connectors, and/or the like. Therefore, the ATE framework can be reconfigured to test many different variations of the DUTs by simply changing the device interface board. Similarly, one tester unit of the ATE framework can test one instance of DUTs utilizing one instance of a device interface board, while another tester unit can test another instance of DUTs utilizing another instance of the device interface board.

In aspects, the ATE framework can further include a plurality Universal Asynchronous Receiver Transmitter (UART) communication links 255a-255n communicatively coupling the plurality of DUTs 244a-244n to the plurality of FPGA tester boards 230a-230y. The UART communication links 255a-255n can be separate serial communication links, or can be coupled through the connectors 250a-250n of the DUTs 245a-245n. In one implementation, up to 64 DUTs 245a-245n can be coupled to each tester unit 215a-215m. The embedded OS 240 can be configured to provide functionality to 1) communicate with the PU boards 225a-225x within the tester units 215a-215m, 2) communicate with the FPGA tester boards 230a-230y, and 3) communicate with the DUTs 245a-245n over the respective UART communication links 255a-255n.

In aspects, the DUTs 245a-245n include a Built-in-Self-Test (BIST) circuits 260a-260n. The BIST circuit 260a-260n can be of any design, either a commercially available design or of a proprietary design. The BIST circuits 260a-260n integral to the DUTs can be configured to generate test input data (e.g., test patterns) based on its own testing algorithms and apply the test signals to the DUTs 245a-245n. The BIST circuits 260a-260n can also be configured to capture test output data. The BIST circuits 260a-260n can perform most or all of the testing functionality internal to the DUTs 245a-245n.

Figure 3:
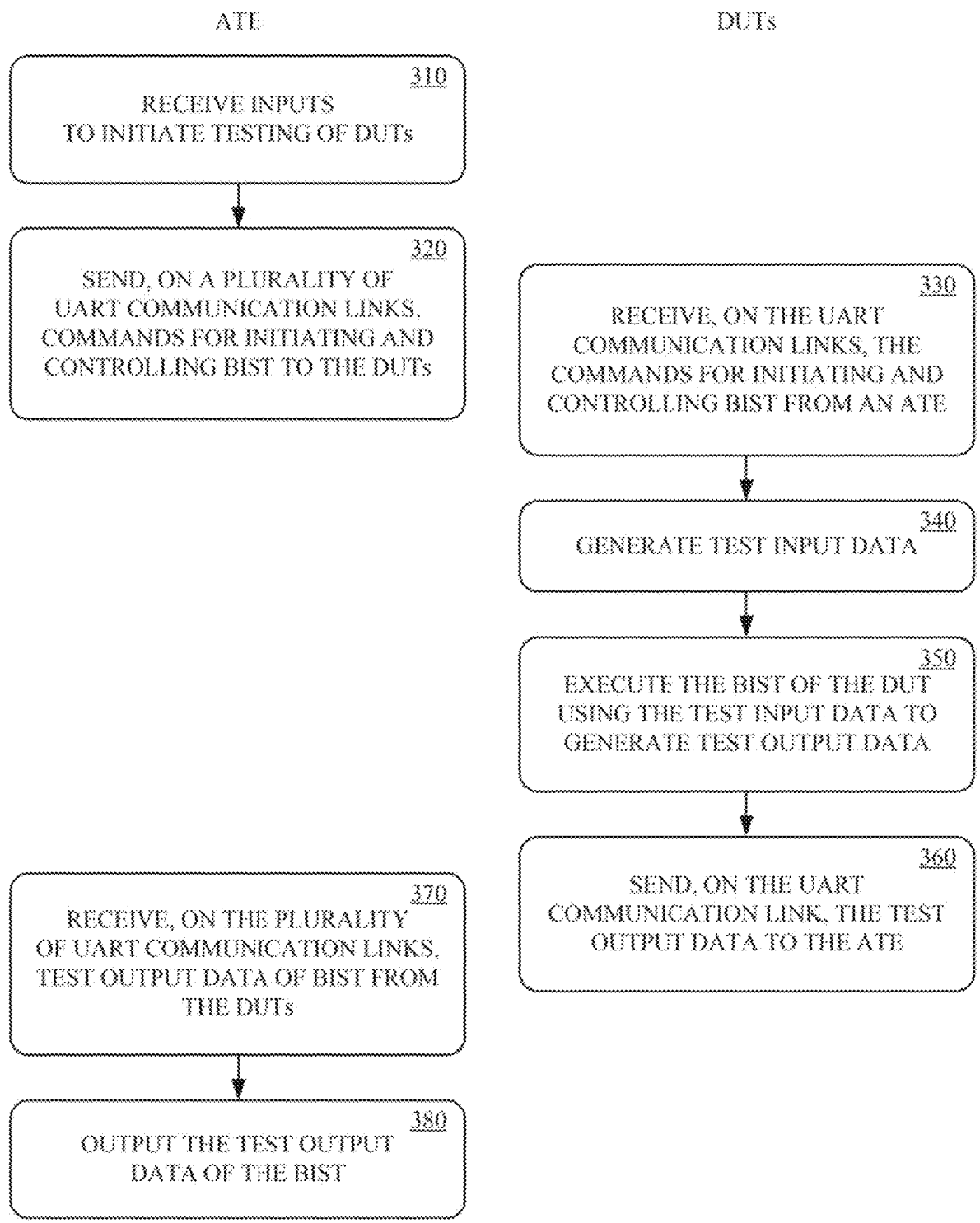
FIG. 3 shows an automatic test method, in accordance with aspect of the present technology.

Operation of the ATE framework will be further described with reference to FIG. 3, which shows an automated test method in accordance with aspects of the present technology. The method or portions thereof may be implemented as computing device-executable instructions (e.g., computer program) that are stored in computing device-readable media (e.g., computer memory) and executed by a computing device (e.g., processor).

The automated test method can include receiving one or more inputs to initiate testing of a plurality of DUTs 245a-245n, at 310. In one implementation, the host controller 205 can receive one or more user inputs to initiate testing of the plurality of DUTs 245a-245n. At 320, the one or more tester unit 215a-215m can send one or more commands for initiating and controlling a BIST by the BIST circuits 260a-260n of the DUTs 245a-245n on a plurality of serial communication links 255a-255n to the plurality of DUTs 245a-245n in response to the received input to initiate testing of the DUTs 245a-245n. In one implementation, the commands for initiating and controlling the BIST can be sent from UARTs in the plurality of FPGA tester boards 230a-230y of the one or more tester unit 215a-215m to the DUTs 245a-245n. In another implementation, the commands for initiating and controlling the BIST can be sent form UARTs in the one or more DIBs 220a-220m.

At 330, the commands for initiating and controlling the BIST can be received by the plurality of DUTs 245a-245n from the ATE framework. In one implementation, UART circuits in the plurality of DUTs 245a-245n can receive the commands for initiating and controlling the BIST on the plurality of UART communication links 255a-255n from the plurality of FPGA tester boards 230a-230y of the one or more tester unit 215a-215m. In another implementation the commands can be received from UARTs in the one or more DIBs 220a-220m. At 340, the BIST circuits 260a-260n of the plurality of DUTs 245a-245n can generate test input data in response to the received commands for initiating and controlling the BIST. In one implementation, the BIST circuits 260a-260n can generate one or more test patterns in accordance with the received commands for initiating and controlling BIST. At 350, the BIST circuits 260a-260n can execute the BIST of the plurality of DUTs 245a-245n using the test input data to generate test output data. In one implementation, the BIST circuits 260a-260n can apply input test patterns to the DUTs 245a-245n, and compare resulting test patterns to expected test patterns to determine pass/fail results to generate the test output data. At 360, the DUTs 245a-245n can send the test output data on the serial communication links 255a-255n to respective tester units 215a-215m of the ATE framework. In one implementation, UART circuits in the plurality of DUTs 245a-245n can send the test output data to the FPGA tester boards 230a-230y of the one or more tester unit 215a-215m.

At 370, test output data of the BIST can be received on the plurality of UART communication links 255a-255n by the one or more tester units 215a-215m from the plurality of DUTs 245a-245n. In one implementation, the plurality of FPGA tester boards 230a-230y of the tester units 215a-215m can receive the test output data of the BIST from the plurality of respective DUTs 245a-245n. At 380, the test output data of the BIST can be output. In one implementation, outputting the test output data of the BIST can include one or more of storing the test output data by the host controller 205, displaying the test output data to a user by the host controller 205, printing the test output data on a printer of the host controller 205, and/or the like.

Aspects of the present technology advantageously do not utilize the standard DUT connectors 250a-250n between the device interface boards 220a-220m and the plurality of DUTs 245a-245n to communicate with respective FPGA tester boards 230a-230y. Instead, the UART serial communication links 255a-255n are utilized to communicate between the DUTs 245a-245n and the respective tester units 215a-215m, thereby greatly reducing the functionality required by the ATE framework. The ATE framework can advantageously provide for volume DUT testing wherein the test algorithms and test data are performed and/or generated internally to the DUTs employing built in BIST functionality and circuits. As a result of the reduced functionality required for initiating the BIST of the DUTs and receiving the test output data from the BIST, the ATE framework can be implemented at a significantly lower cost. Furthermore, the use of the UART communication links can advantageously reduce system complexity and cost. In addition, the tester units 215a-215m can advantageously be racked together for volume testing of the DUTs 245a-245n, thereby providing very economical testing of volume DUTs 245a-245n such as SSDs.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. An Automatic Test Equipment (ATE) framework comprising:
    a host controller configured to receive one or more inputs to initiate testing of a plurality of Devices Under Test (DUTs);
    one or more tester units including a plurality of Universal Asynchronous Receiver-Transmitters (UARTs) communication links configured,
        to send one or more commands for initiating and controlling a Built-in-Self-Test (BIST) in the plurality of DUTs, and
        receive test output data of the BIST from the plurality of DUTs; and
    the host controller further configured to output the test output data of the BIST; and
    one or more Device interface Boards (DIBs) configured to couple a given type of the plurality of DUTs to the one or more tester units.

2. The ATE framework of claim 1, wherein the one or more DIB includes the plurality of UARTs.

3. The ATE framework of claim 1, further comprising:
    a plurality of standard DUT connectors configured to couple the plurality of DUTs to the one or more DIBs.

4. The ATE framework of claim 3, wherein the plurality of standard DUT connectors include Small Computer System Interface (SAS) communication links.

5. The ATE framework of claim 3, wherein the plurality of standard DUT connectors include Serial AT Attachment (SATA) communication links.

6. The ATE framework of claim 1, further comprising:
    the plurality of DUTs including BIST circuits, wherein the BIST circuits are configured to,
        receive, on respective ones of the plurality of UART communication links, the one or more commands for initiating and controlling the BIST of the BIST circuits,
        generate test input data in response to the one or more commands for initiating and controlling the BIST,
        execute the BIST of the BIST circuits, using the test input data to generate the test output data, and
        send, on respective ones of the plurality of UART communication links, the test output data.

7. The ATE framework of claim 6, wherein the plurality of DUTs include Serial Attached Small Computer System Interface (SAS) based Solid State Drives (SSD).

8. The ATE framework of claim 6, wherein the plurality of DUTS include Serial AT Attachment (SATA) based Solid State Drives (SSD).

9. The ATE framework of claim 1, further comprising:
    a communication backplane configured to communicatively coupled the one or more tester units to the host controller.

10. An automatic test method comprising:
receiving one or more inputs to initiate testing of a plurality of Devices Under Test (DUTs);
sending one or more commands for initiating and controlling a Built-in-Self-Test (BIST) by a plurality of Universal Asynchronous Receiver-Transmitters (UARTs) of a Device Interface Board (DIB) on a plurality of serial communication links to the plurality of DUTs;
receiving test output data of the BIST by the plurality of UARTs of the DIB on the plurality of serial communication links from the plurality of DUTs; and
outputting the test output data of the BIST.

11. The automatic test method of claim 10, further comprising:
receiving by a host controller the one or more inputs to initiate testing of the plurality of DUTs.

12. The automatic test method of claim 10, further comprising:
outputting by a host controller the test output data of the BIST.

13. The automatic test method of claim 10, thither comprising:
receiving the one or more commands for initiating and controlling the BIST by a respective UART of the plurality of DUTs;
generating test input data by respective ones of the plurality of DUTs in response to the received one or more commands for initiating and controlling the BIST;
executing the BIST on respective ones of the plurality of DUTs using the test input data in response to the received one or more command for initiating and controlling the BIST; and
sending the test output data by the respective UART of the plurality of DUTs on the plurality of serial communication links.

14. The automatic test method of claim 13, wherein the plurality of DUTs comprises Serial Attached Small Computer System Interface (SAS) based Solid State Drives (SSD).

15. The automatic test method of claim 13, wherein the plurality of DUTs comprises Serial AT Attachment (SATA) based Solid State Drives (SSD).

16. An Automatic Test Equipment (ATE) framework comprising:
a host, controller configured to receive one or more inputs to initiate testing of a plurality of Devices Under Test (DUTs);
one or more tester units including:
a plurality of Universal Asynchronous Receiver-Transmitters (UARTs) communication links configured to send one or more commands for initiating and controlling a Built-in-Self-Test (BIST) in the plurality of DUTs, and to receive test output data of the BIST from the plurality of DUTs;
a plurality of Processing Unit (PU) boards, wherein a given one of the plurality of PU boards of each of the one or more tester units are configured to implement an embedded Operating System (OS);
a plurality of Field Programmable Array (FPGA) test boards;
one or more drivers communicatively coupling the plurality of FPGA test boards to the plurality of PU boards; and
wherein the embedded OS is configured to communicate with the plurality of PU boards, communicate with the plurality of FPGA test boards, and communicate with the plurality of DUTs over the respective UART communication links; and
the host controller further configured to output the test output data of the BIST.

17. The ATE framework of claim 16, wherein the plurality of FPGA test boards include the plurality of UARTs.

18. The ATE framework of claim 16, further comprising one or more Device Interface Boards (DIBs) configured to couple a given type of the plurality of DUTs to the one or more tester units.

19. The ATE framework of claim 16, further comprising:
the plurality of DUTs including BIST circuits, wherein the BIST circuits are configured to,
receive, on respective ones of the plurality of UART communication links, the one or more commands for initiating and controlling the BIST of the BIST circuits,
generate test input data in response to the one or more commands for initiating and controlling the BIST,
execute the BIST of the BIST circuits, using the test input data to generate the test output data, and
send, on respective ones of the plurality of UART communication links, the test output data.

20. The ATE framework of claim 16, further comprising:
a communication backplane configured to communicatively coupled the one or more tester units to the host controller.

* * * * *